(12) United States Patent
Aki et al.

(10) Patent No.: US 7,179,844 B2
(45) Date of Patent: Feb. 20, 2007

(54) DIELECTRIC RESIN FOAM AND LENS FOR RADIO WAVES USING THE SAME

(75) Inventors: Minoru Aki, Tokushima (JP); Hiroyuki Monde, Tokushima (JP); Akira Tabuchi, Tokushima (JP); Yoshifumi Tachi, Naruto (JP); Syougo Kawakami, Osaka (JP); Masatoshi Kuroda, Osaka (JP); Tetsuo Kishimoto, Osaka (JP); Kouichi Kimura, Osaka (JP)

(73) Assignees: Otsuka Chemical Co., Ltd., Osaka (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/333,893

(22) PCT Filed: Jul. 25, 2001

(86) PCT No.: PCT/JP01/06407

§ 371 (c)(1),
(2), (4) Date: Apr. 3, 2003

(87) PCT Pub. No.: WO02/10266

PCT Pub. Date: Feb. 7, 2002

(65) Prior Publication Data

US 2004/0029985 A1    Feb. 12, 2004

(30) Foreign Application Priority Data

Jul. 27, 2000 (JP) ............................. 2000-227971
Jul. 24, 2001 (JP) ............................. 2001-222685

(51) Int. Cl.
*C08J 9/00* (2006.01)
*H01Q 15/08* (2006.01)

(52) U.S. Cl. ................ 521/92; 343/911 R; 343/911 L; 342/11

(58) Field of Classification Search ................ 521/92; 343/911 R, 911 L; 342/11
See application file for complete search history.

(56) References Cited

U.S. PATENT DOCUMENTS 3,321,765 A * 5/1967 Peters et al. ............ 343/911 R
4,996,097 A   2/1991 Fischer
5,538,756 A   7/1996 Korleski et al.

FOREIGN PATENT DOCUMENTS

| EP | 0 632 524 | 1/1995 |
|----|-----------|--------|
| JP | 45-17242 | 6/1970 |
| JP | 56-17767 | 4/1981 |
| JP | 60-188465 | 9/1985 |
| JP | 60-215586 | * 11/1985 |
| JP | 5-299871 | 11/1993 |
| JP | 7-16941 | 1/1995 |
| JP | 7-320537 | 12/1995 |
| JP | 8-105188 | 4/1996 |
| JP | 8-133832 | 5/1996 |
| JP | 8-181482 | 7/1996 |
| JP | 8-281869 | 10/1996 |

OTHER PUBLICATIONS

English Abstract of Japan Patent Application No. 4102732 filed on Apr. 22, 1992 (1 page).
English Abstract of Japan Patent Application No. 06111375 filed on May 25, 1994 (1 page).
Supplementary European Search Report dated Jan. 27, 2005 (3 pages).
Official Action for Russian Patent Application No. 2003105465 dated Mar. 15, 2004 (7 pages).
English Translation of Official Action for Russian Patent Application No. 2003105465 dated Mar. 15, 2004 (4 pages).
Official Action for Russian Patent Application No. 2003105465 dated Aug. 24, 2004 (3 pages).
English Translation of Official Action for Russian Patent Application No. 2003105465 dated Aug. 24, 2004 (3 pages).
Communication pursuant to Article 96(2) from the European Patent Office, mailed Jan. 11, 2006, corresponding to European patent application No. 01953 313.2, 3 pages.
English version of Japanese Publication of Examined Patent Application No. Sho-56-17767, Publication Date: Apr. 24, 1981, 1 page.
English version of Japanese Publication of Examined Patent Application No. Sho-45-17242, Publication Date: Jun. 15, 1970, 1 page.
English translation of Japanese patent application No. Hei-05-299871, Publication Date: Nov. 12, 1993, 6 pages.
English translation of Japanese patent application publication No. Hei-08-133832, Publication Date: May 28, 1996, 9 pages.
English translation of Japanese patent application No. Hei-07-320537, Publication Date: Dec. 8, 1995, 4 pages.
Patent Abstracts of Japan, Publication No.: 07-016941, Publication Date: Jan. 20, 1995, 2 pages.
Korean Office Action for Korean Patent Application No.: 10-2003-7000090, mailed on Jun. 22, 2006, and English translation thereof, 7 pages.

* cited by examiner

*Primary Examiner*—Irina S. Zemel
(74) *Attorney, Agent, or Firm*—Osha Liang LLP

(57) ABSTRACT

It is an object of the present invention to provide a dielectric resin foam which has high and uniform dielectric properties and is preferable for use as various dielectric materials. A dielectric resin foam obtained by expanding a resin composition comprising a synthetic resin and a fibrous and/or plate-like dielectric inorganic filler is provided.

2 Claims, 3 Drawing Sheets

DIELECTRIC RESIN FOAM AND LENS FOR RADIO WAVES USING THE SAME

TECHNICAL FIELD

The present invention relates to a dielectric resin foam and a lens for radio waves using the same. More specifically, the present invention relates to a dielectric resin foam that has superior dielectric properties and is of a light weight, as well as being capable of being formed in a reduced size, enabling itself to be preferably used as a dielectric material for electronic devices in information and telecommunication fields such as an antenna, a condenser, a laminated circuit substrate, a connector, a memory and the like, and a lens for radio waves using the dielectric resin.

BACKGROUND ART

The recent drastic increase in the amount of signal information transmitted by a radio wave, which resulted from the remarkable improvement of information and telecommunication technologies, requires better accuracy and swiftness of the signal information and further increase in the amount of information, as well as has caused a rapid movement to the use of high-frequency radio waves, which in turn realized a full-scale use of a high-frequency band such as of 1 GHz or more, specifically of 10 to 20 GHz, which was not used before.

For example, for satellite communication, receiving and transmitting of radio waves are mainly performed by a parabola antenna with its antenna direction fixed, utilizing a stationary satellite. However, this transmission and receiving system can only handle a limited amount of information, which has caused a demand for a communication system capable of handling a larger amount of information. A recently established radio-wave communication system involves a lot of low-earth-orbit transfer satellites around the earth, through which radio waves are transmitted received, and a movable antenna located on the ground, which tracks the transfer satellites. This communication system has a superior advantage that every home user can transmit and receive a large amount of information through this system, which is comparable to an optical fiber.

As a lens antenna used in a movable antenna system for tracking low-earth-orbit transfer satellites, a Luneberg lens antenna (a dome type antenna, i.e., an antenna comprising a Luneberg lens) is used. This antenna has an advantage that it can handle radio waves coming from or transmitted to multiple directions simultaneously, and therefore is most suitable for a movable antenna system for tracking low-earth-orbit transfer satellites.

The Luneberg lens antenna includes a Luneberg lens which is capable of, for example, focusing radio waves. The lens used in this antenna is required to possess superior dielectric properties (e.g., high specific inductive capacity and low dielectric loss) so that it can handle a large amount of information, i.e. high-frequency radio waves, and to have a small dimension and low weight for workability and safety, since the antenna with this lens is installed on a roof of a domestic facility. For this, in Europe, the weight of a Luneberg lens antenna is officially standardized for installation works.

Meanwhile, various dielectric resin compositions as dielectric materials with good fabrication properties that are required for bulk production have been proposed, each comprising a synthetic resin and a dielectric inorganic filler, so as to cope with downsizing, weight saving and performance improvement of dielectric parts, which make up electronic devices such as an antenna, a condenser, a laminated circuit substrate, a connector and a memory.

For example, a dielectric resin composition comprising a synthetic resin and a powdery dielectric substance such as an alkaline earth metal titanate salt (e.g. barium titanate, strontium titanate, and barium strontium titanate) and the like has been known. A Luneberg lens using said dielectric resin composition has also been proposed (Japanese Patent Application Publication No. Sho-45-17242, Japanese Patent Application Publication No. Sho-56-17767). However, in order to obtain dielectric properties (high dielectric constant and low dielectric loss) that can cope with high-frequency radio waves by merely incorporating a powdery dielectric substance into a synthetic resin, a large amount of the powdery dielectric substance must be incorporated, which precludes those dielectric parts from having decreased weight and small dimension.

A dielectric resin composition comprising a synthetic resin and a fibrous alkaline earth metal titanate salt and the like has also been proposed (for example, Japanese Patent Application Laid-open No. Hei-5-299871). The fibrous dielectric substance can provide dielectric properties capable of handling high-frequency radio waves, even if it is contained in an amount less than that of the powdery dielectric substance, and therefore can save the weight thereof by some extent. On the other hand, the fibrous dielectric substance has such a property as to be oriented in a uniform direction in the synthetic resin and shows different dielectric properties in the substance between the orientation direction and the direction perpendicular thereto. This property is not a major problem in practical use of the existing electronic devices. However, in the progress of using higher-frequency radio waves and developments of electronic devices matching thereto, the dielectric parts which constitute said devices are required to have higher and more uniform dielectric properties, and therefore further improvements thereof are desired.

Furthermore, for example, Japanese Patent Laid-open No. Hei-8-133832 discloses a dielectric resin composition, in which a plate-like dielectric substance, which contains barium, titanium and rare earth elements as main components, is mixed in a synthetic resin. Since the plate-like dielectric substance, even if it is contained in an amount less than that of the powdery dielectric substance, can realize dielectric properties that can achieve a radio wave communication in a high frequency band, it contributes to weight saving by some extent in the same manner as done by the fibrous dielectric substance. However, the plate-like substance is also oriented in the synthetic resin, although the orientation does not extend to such a degree as the fibrous substance. This orientation of the substance may cause an ununiform dielectric profile, and therefore there still remains the necessity for improvement for the purpose of providing more uniform dielectric properties.

On the other hand, Japanese Patent Application Laid-open No. Hei-7-320537 discloses a dielectric polyurethane foam obtained by incorporating a powdery alkaline earth metal titanate into polyurethane and expanding the mixture. However, in order to enhance the dielectric characteristic of said foam to such an extent as to render a high-frequency radio wave usable, a large amount of powdery dielectric substance must be incorporated. This prevents downsizing and weight saving. Moreover, a large amount of powdery dielectric substance incorporated causes the mechanical strength of a resulting foam to be substantially decreased, which makes the foam impractical.

DISCLOSURE OF THE INVENTION

Therefore, the present inventors conducted intensive studies to solve the above-mentioned problems of the conventional arts, and succeeded in obtaining a novel dielectric resin foam, through which the present invention has been conceived.

Namely, the present invention relates to a dielectric resin foam obtained by expanding a dielectric resin composition comprising a synthetic resin and a fibrous and/or plate-like dielectric inorganic filler.

As used herein, by the fibrous and/or plate-like dielectric inorganic filler is meant one of or both of the fibrous dielectric inorganic filler and plate-like inorganic filler.

The present inventors have found that, when the dielectric resin composition is expansion molded into such as spherical shape after the fibrous or plate-like dielectric inorganic filler has been incorporated into the synthetic resin, rather than the filler is not merely incorporated in the synthetic resin, the plate-like or fibrous dielectric inorganic filler is not oriented in a uniform direction in the synthetic resin but is dispersed ununiformly, hence enabling a resin foam to have not only a superior dielectric properties but also uniform dielectric properties.

Therefore, the dielectric resin foam of the present invention has superior dielectric properties that can cope with high-frequency radio waves, i.e., those with high dielectric constant, low dielectric loss and the like, and has quite uniform dielectric properties. Furthermore, since the foam is of a lightweight, it can be miniaturized. Moreover, since the foam comprises a fibrous and/or plate-like dielectric inorganic filler, it has high mechanical strength and heat resistance.

The dielectric resin foam of the present invention can be preferably used as a material for various dielectric parts of electronic devices relating to information and telecommunication technologies such as an antenna, a condenser, a laminated circuit substrate, a connector and a memory.

Furthermore, a lens made of the dielectric resin foam of the present invention has been miniaturized and weight saved while possessing high and uniform dielectric properties. This lens is formed into a spherical shape or a Luneberg-lens like shape (each includes hemispherical shape), so that radio waves transmitted to and received from all directions can be focused or diffused smoothly without electric wave hindrance.

As used herein, the Luneberg lens is of a spherical shape (including hemispherical type) with multiple layers having different specific inductive capacities concentrically overlapped to each other, thereby forming a concentric sphere. The layers are generally formed so that a peripheral layer has a lower dielectric constant.

For example, a Luneberg lens which is equipped in a Luneberg lens antenna for tracking a low-earth-orbit satellite may have a dielectric constant of not less than 1.5 at 12 GHz and 25° C. and a specific gravity of not more than 0.5, and preferably a dielectric constant of not less than 2.0 and a specific gravity of not more than 0.5 under the above condition. The thus formed lens can cope with a high frequency band of not less than 10 GHz, specifically in the range of 12 to 20 GHz. Since the lens has such superior dielectric properties and low specific gravity, it can be miniaturized and weight-saved, for example, it may have a diameter of about 10 to 30 cm and a weight of about several kilograms.

BEST MODE FOR CARRYING OUT THE PRESENT INVENTION

Figure 1:
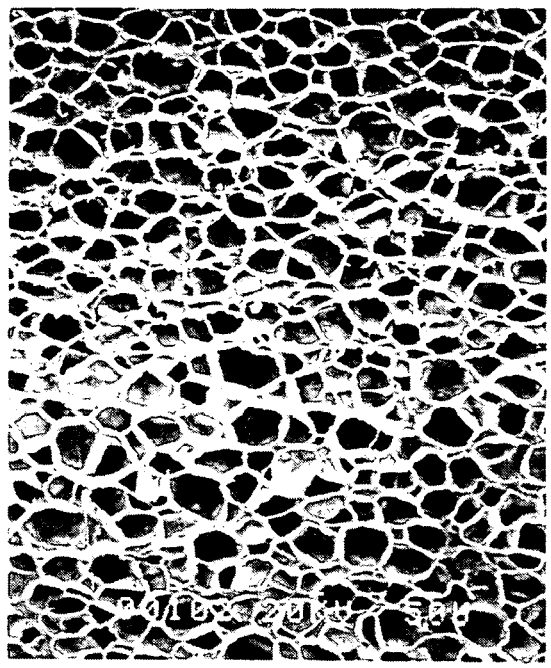
FIG. 1 shows an electric microscope photograph (100 magnifications) as an alternative to a figure, which shows the state of dispersion of the dielectric inorganic filler on the cutting plane of the dielectric resin foam according to the present invention (Example 6).

A synthetic resin used for the present invention is not specifically limited, and various thermoplastic resins and thermosetting resins can be used. Specific examples of the thermoplastic resin include, for example, polyethylene, polypropylene, polyisoprene, chlorinated polyethylene, polyvinyl chloride, polybutadiene, polystyrene, high impact polystyrene, acrylonitrile-styrene resin (AS resin), acrylonitrile-butadiene-styrene resin (ABS resin), methyl methacrylate-butadiene-styrene resin (MBS resin), methyl methacrylate-acrylonitrile-butadiene-styrene resin (MABS resin), acrylonitrile-acrylic rubber-styrene resin (AAS resin), acrylic resin, polyester (polyethylene terephthalate, polybutylene terephthalate, polyethylene naphthalate and the like), polycarbonate, polyphenylene ether, modified polyphenylene ether, aliphatic polyamide, aromatic polyamide, polyphenylene sulfide, polyimide, polyether ether ketone, polysulfone, polyarylate, polyether ketone, polyether nitrile, polythioether sulfone, polyether sulfone, polybenzimidazole, polyamideimide, polyetherimide, liquid crystalline polymer and the like. Of these resins, polyethylene, polypropylene, polystyrene, acrylic resin and the like are preferred in light of expansion forming properties, dielectric properties (specifically low dielectric loss) and the like. One of the thermoplastic resins may be used solely, or the mixture of two or more of them may optionally be used. The specific examples of the thermosetting resin include, for example, polyurethane, phenol resin, melamine resin, urea resin, unsaturated polyester resin, diallylphthalate resin, silicone resin, epoxy resin (bisphenol A type epoxy resin, bisphenol F type epoxy resin, bisphenol AD type epoxy resin, phenol novolak type epoxy resin, cresol novolak type epoxy resin, cyclic aliphatic epoxy resin, glycidyl ester epoxy resin, glycidyl amine epoxy resin, heterocyclic epoxy resin, urethane modified epoxy resin, brominated bisphenol A type epoxy resin) and the like. Of these resins, silicone resin, polyurethane, epoxy resin and the like are preferred. One of the thermosetting resins may be used solely, or the mixture of two or more of them may optionally be used.

In the present invention, among the synthetic resins, thermoplastic resins are preferably used in light of the fabrication properties and the like.

For example, when the dielectric resin foam of the present invention is used for a lens, specifically a spherical lens or Luneberg lens, a thermoplastic resin is preferable when considering moldability, dielectric properties, weather resistance and the like, and of which, polyolefins such as polyethylene, polypropylene, polystyrene and the like are specifically preferred.

The fibrous or plate-like dielectric inorganic filler which is incorporated into the synthetic resin may include, for example, a filler having a composition represented by the general formula: $MO.nTiO_2$ (wherein M is one or more divalent metal(s) and n is an integer of not less than 1) and having a fibrous or plate-like shape.

The divalent metal which is represented by M in the above-mentioned general formula include, and not specifically limited to, as long as the oxide shows dielectric properties, for example, alkaline earth metals such as barium, strontium, calcium, magnesium and the like, and lead and the like. The term "plate-like" shape also includes "scaly", "micaceous", "flaky" and the like shape.

For both the fibrous alkaline earth metal titanate salt and fibrous lead titanate, any of the known substances may be used.

The plate-like alkaline earth metal titanate salt and plate-like lead titanate can be produced, for example, by reacting a mixture of plate-like titanium oxide with one or more of salt(s) such as an oxide, a hydroxide, an inorganic acid salt, an organic acid salt and the like of the alkaline earth metal or lead, under the temperature of 500 to 1400° C., or by other methods. The plate-like titanium oxide, one of the raw materials, can be produced by known methods described in, for example, Japanese Patent Application Publication No. Hei-6-88786, Japanese Patent Application Laid-open No. Hei-5-221795, and Japanese Patent Application Laid-open No. Hei-10-95617. The reaction of the plate-like titanium oxide with alkaline earth metal salt or lead salt can be carried out following a similar procedure to that of the reaction of the fibrous titanium oxide with the alkaline earth metal salt or lead salt (as mentioned below). The reaction of the fibrous titanium oxide with the alkaline earth metal salt or lead salt is known, and can be carried out following, for example, a hydrothermal method, baking method, wet deposition baking method, flux method and the like.

The specific examples of the fibrous or plate-like alkaline earth metal titanate salt and lead titanate may include, for example, barium titanate, calcium titanate, magnesium titanate, strontium titanate, barium strontium titanate, barium calcium titanate, calcium strontium titanate, lead titanate and the like, each of which has a fibrous or plate-like shape. These may be a composition material with other ceramic materials such as titanium oxide. Of them, calcium titanate is preferably used since it has low dielectric loss at the high frequency band. One of the fibrous and plate-like alkaline earth metal titanates, or fibrous or plate-like lead titanate may be used solely, or two or more of them may be used in combination. Furthermore, the fibrous and plate-like ones may used in combination.

Although the size of the fibrous dielectric inorganic filler is not specifically limited, the fibrous filler generally having a mean fiber diameter of about 0.01 to 1 μm, preferably of about 0.05 to 0.5 μm, a mean fiber length of about 0.5 to 100 μm, preferably of about 3 to 50 μm and an aspect ratio (mean fiber length/mean fiber diameter) of not less than 5, preferably of not less than 10 may be used. Also, although the size of the plate-like dielectric inorganic filler is not specifically limited, the plate-like filler having a mean long diameter of about 0.5 to 100 μm, preferably of about 1 to 20 μm, a mean short diameter of about 0.2 to 100 μm, preferably of about 0.5 to 20 μm, a mean thickness of about 0.01 to 10 μm, preferably of about 0.05 to 5 μm and an aspect ratio (mean long diameter/mean thickness) of about 3 to 100, preferably of about 5 to 50 may be used.

The amount of the fibrous and/or plate-like dielectric inorganic filler to be incorporated into the synthetic resin is not specifically limited, and it may be suitably selected from the wide range, depending on the various conditions such as the kind of the synthetic resin, the kind(s) of the fibrous and/or plate-like inorganic filler and the shape thereof (including sole use of the fibrous or plate-like filler, or combination use thereof), the application of the obtained material, the kind(s) of the resin additives which is(are) optionally incorporated into the resin and the amount of additive(s) to be incorporated, and the like. For example, the fibrous and/or plate-like dielectric inorganic filler in an amount of generally 30 to 80 wt %, preferably 45 to 75 wt % of the total amount of the dielectric resin composition is preferably incorporated into the resin in light of the easiness of setting of the dielectric constant within the preferred range (a range wherein the dielectric constant at 12 GHz, 25° C. is not less than 1.5, specifically not less than 2.0) and obtaining the fabrication properties and expansion properties (including expansion handling properties during working) and the like.

The dielectric resin foam of the present invention can be produced by mixing a synthetic resin, a fibrous and/or plate-like dielectric inorganic filler and optionally a resin additive to have a dielectric resin composition, and expansion forming the dielectric resin composition into spherical or the like shape.

The resin additive may be incorporated into the resin, as long as it does not deteriorate the preferred properties of the dielectric resin foam of the present invention and does not disturb a subsequent expansion procedure. As the resin additive, any additives which have been conventionally incorporated into synthetic resins may be used, which include, for example, a heat stabilizer (e.g., phosphorous acid, hindered phenol, phosphate), a lubricant, a release agent, a dye and a pigment (e.g., chromium yellow), an ultraviolet absorber (for example, benzotriazole ultraviolet absorber), a flame retardant (e.g., phosphazene, phosphate ester), a lubricant, a filler (e.g., titanium dioxide, calcium carbonate, talc) and the like. Two or more of these resin additives may be used in combination.

Furthermore, in the present invention, the powdery dielectric substance which has been conventionally used may also be incorporated into the resin in addition to the fibrous and/or plate-like dielectric inorganic filler within such a range as not to deteriorate the preferred properties of the dielectric resin foam of the present invention.

The mixing of the synthetic resin, fibrous and/or plate-like dielectric inorganic filler, resin additive and the like can be carried out following known methods, for example, the materials may be mixed with various mixing apparatus such as a biaxial extruder, a uniaxial screw extruder, a co-kneader, a multiaxial screw extruder, a kneader, a mixing roll, a stirrer, a Banbury mixer and the like.

The method for expansion forming the thus-obtained dielectric resin composition into spherical or the like shape is not specifically limited, and can be carried out by any methods such as heat decomposition expansion method, beads expansion method, supercritical fluid method and the like.

Heat decomposition expansion using thermal decomposition type compound is preferably used since it is an easy and low-cost method. When a thermal decomposition type compound, i.e. an expansion agent is used, the expansion is carried out by mixing the expansion agent with the synthetic resin, fibrous and/or plate-like dielectric inorganic filler, resin additive and the like, filling the obtained resin composition into a suitable mold having spherical or the like shape and heating under pressure or without pressure. A known agent may be used as the expansion agent, and may include, for example, ADCA (azodicarboxylicamide), OBSH (p,p'-oxybisbenzenesulfonylhydrazide), DPT (dinitropentamethylenetetramine), TSH (p-toluenesulfonylhydrazide), BSH (benzenesulfonylhydrazide), and salts such as calcium salt, aluminum salt, barium salt, strontium salt and the like thereof, sodium bicarbonate, monosodium citric anhydride and the like. Of them, ADCA is preferable for use, since it can provide uniform and fine foam and is also advantageous in keeping material strength and low dielectric loss tangent. The amount of the expansion agent to be used is generally 1 to 20 parts by weight, preferably 3 to 10 parts by weight per 100 parts by weight of the unexpanded material. During the heat decomposition expansion, various adjuvants may be used for the purposes of adjusting the expansion rate, preventing deterioration of the material and the like. Such adjuvants include, for example, tribasic lead sulfate, dibasic phosphite salt, lead stearate, zinc stearate, zinc carbonate, zinc oxide, barium stearate, aluminum stearate, calcium stearate, dibutyltin malate, urea, maleic acid and the like.

Although the expansion ratio of the foam obtained by using a thermal decomposition expansion agent is not specifically limited, the expansion may be carried out generally with the expansion ratio of about 2 to 20 times, preferably about 5 to 15 times, when considering the decrease of strength due to the plastic deformation of the obtained material or weight saving and the like.

Furthermore, a bead expansion process is effective in producing the foam of the present invention. In the present invention, the expansion of beads can be carried out following a known method. For example, the dielectric resin foam of the present invention can be produced by melt-kneading a synthetic resin and a fibrous and/or plate-like dielectric inorganic filler to have particles (beads) having desired shape, pre-expanding the particles to have pre-expanded particles, optionally subjecting the particles to a temperature between room temperature and a temperature higher than room temperature by about 10 to 30° C. for about several hours, filling the particles into a mold having spherical or the like shape, and heating the particles either under pressure or without pressure to heat fuse and expansion mold the pre-expanded particles.

In order to melt-knead the synthetic resin and fibrous and/or plate-like dielectric inorganic filler, the above-mentioned general mixing apparatus may be used. The particles that are obtained by melt-kneading is not specifically limited in shape, and may be of a desired shape, for example, a cylindrical shape, an elliptical spherical shape, a spherical shape, a cubic shape, a cuboid shape, a tetrapot shape and the like. Although the particles is not limited in size, the particle size may generally be about 0.05 to 5 mm, preferably about 0.1 to 3 mm, when considering workability, any other properties such as mechanical strength of the resultant lens such as a Luneberg lens. During melt-kneading of the synthetic resin and fibrous and/or plate-like dielectric inorganic filler, a suitable amount of the other resin additives may be incorporated. These resin additives may include, for example, an air bubble regulator such as talc powder, a nucleus agent such as sodium carbonate, an antioxidant, a heat stabilizer, an ultraviolet absorber, a lubricant, a release agent, a dye, a pigment, an antistatic agent, a filler and the like. One of the resin additives may be used solely or two or more of them may be used in combination.

The pre-expansion of the particles of the synthetic resin and fibrous and/or plate-like dielectric inorganic filler can also be carried out by known methods. For example, a water dispersion of the particles is mixed with a volatile expansion agent to have a mixture, which is then hot-mixed under pressure in a pressure-resistant vessel such as an autoclave to impregnate the particles with the volatile expansion agent. The particles which have been impregnated with the volatile expansion agent are then released into a space in which the pressure is lower than that of the pressure-resistant vessel or into the atmosphere, thus causing expansion to have the pre-expanded particles.

During dispersion of the particles of the synthetic resin and fibrous and/or plate-like dielectric inorganic filler into water, as a dispersing agent, for example, basic calcium triphosphate, basic magnesium carbonate, calcium carbonate and the like, and as a dispersion aid, for example, sodium dodecylbenzenesulfonate, sodium n-pallafin sulfonate, sodium α-olefin sulfonate and the like, may be incorporated. Although the amounts of the dispersing agent and dispersion aid to be incorporated are not specifically limited and may be suitably selected from the wide range depending on the conditions such as the kind of the synthetic resin, the shape and kind of the dielectric inorganic filler and the like, while generally, about 0.1 to 5 parts by weight of the dispersing agent and about 0.001 to 3 parts by weight of the dispersion aid per 100 parts by weight of water may be incorporated.

As the volatile expansion agent, any agents generally used in expansion of beads may be used, and may include, for example, aliphatic hydrocarbons such as propane, butane, isobutane, pentane and hexane, alicyclic hydrocarbons such as cyclobutane, cyclopentane and cyclohexane, lower alcohols such as methanol, ethanol, propanol, isopropanol and butanol, halogenated hydrocarbons such as methyl chloride, methylene dichloride, ethyl chloride, trichlorotrifluoromethane, dichlorodifluoromethane, dichlorotetrafluoroethane and trichlorotrifluoromethane, inert gas such as carbon dioxide and nitrogen. One of the volatile expansion agents may be used solely, or two or more of them may be used in combination. Although the amount of the volatile expansion agent to be used is not specifically limited, and may be suitably selected from the wide range depending on set expansion ratios of the pre-expanded particles to be obtained and subsequently produced foam, kind of the synthetic resin, kind and shape of the dielectric inorganic filler, the shape and size of the particles to be pre-expanded and the like, it may be generally about 1 to 80 parts by weight, preferably about 5 to 60 parts by weight, regarding the total weight of the synthetic resin in the particles to be pre-expanded as 100 parts by weight.

In order to impregnate the particles with the volatile expansion agent, the particles may be subjected to heating at about 100 to 150° C. under the pressure of about 10 to 50 kgf/cm$^2$, for generally about 30 minutes. The particles which have been impregnated with the volatile expansion agent are then released, for example, through an orifice pore which has a diameter of about 1 to 10 mm and is provided at the tip of a cap of the pressure-resistant vessel to the air to have the pre-expanded particles. Although the expansion ratio of the pre-expanded particles is not specifically limited, it may be generally about 2 to 100 times, preferably about 5 to 70 times, when considering such as the expansion moldability in the next step.

The pre-expanded particles may be optionally subjected to a temperature between room temperature and a temperature higher than the room temperature by about 10 to 30° C. for about several hours, then filled into a mold, heated and expansion molded. The filling of the pre-expanded particles into the mold can be carried out by the known methods. For example, the pre-expanded particles may be forced to be delivered to the mold with pressured air. A heating manner is also employed. For example, heating may be achieved by feeding steam of about 0.5 to 5 kgf/cm², preferably about 1.0 to 3.5 kgf/cm² into a mold. The heating time may be generally about several seconds to about several minutes, preferably about 10 to 60 seconds. After the expansion molding is finished, the particles may be cooled by means of water-cooling, air-cooling and the like. As such, the foam of the present invention can be produced by beads expansion method.

Furthermore, the expansion method using supercritical fluid may include impregnating a mixture of a resin and a fibrous and/or plate-like dielectric inorganic filler with supercritical carbonic gas and reducing the pressure quickly.

The dielectric resin foam of the present invention may be expansion molded in a mold as described above or shaped by a general process such as cutting after the expansion so as to have a foamed product having a desired shape.

The dielectric resin foam of the present invention may be of a hollow spherical shape (spherical shell shape). Furthermore, the dielectric resin foam of the present invention may be of a spherical shape with multilayer structure, in which two or more layers having different specific inductive capacities are concentrically overlapped to each other, thereby forming a concentric sphere (i.e., Luneberg-lens like shape).

When the dielectric resin foam of the present invention is used for a spherical lens or Luneberg lens, the foam in block form may be produced, cut and processed into a desired shape (for example, spherical shape, spherical shell shape, hemispherical shell shape and the like). However, forming of the dielectric resin into a spherical shape or any other desirable shapes is preferably achieved by using a mold having the desired shape and allowing the resin to be expansion molded into the desired shape within the mold.

Forming of the foam into a Luneberg-lens like shape may be made by combining a spherically shaped member (including a hemispherically shaped member) and multiple (or single) spherical shell member(s) (hollow spherical member) having different specific inductive capacities with respect to each other and to the spherically shaped intermediate.

EXAMPLES

Hereinafter the present invention is exemplified in more detail with reference to the Examples and Comparative Examples.

Example 1

To polyethylene (LDPE, density 0.922, MFR 1.1, 100 parts by weight) were added azodicarbon amide (expansion agent, 5 parts by weight), plate-like calcium titanate (100 parts by weight) and dicumyl peroxide (crosslinking agent, 0.7 parts by weight), and the mixture was melt-kneaded with a mixing roll at 130° C., followed by pressing to have an expandable uncrosslinked sheet having a thickness of 3 mm.

The obtained expandable uncrosslinked sheet was put into a gear oven which had been heated to 160° C., and heated until the expansion ratio reached about 5 times, allowing the resin to be crosslinked and expanded. Thus, a foam having an expansion ratio of about 5 times was obtained.

Example 2

A foam having an expansion ratio of about 5 times was prepared according to a similar method to that of Example 1 except that fibrous calcium titanate was used instead of the plate-like calcium titanate.

Comparative Example 1

A foam having an expansion ratio of about 5 times was prepared according to a similar method to that of Example 1 except that the plate-like calcium titanate was not added.

Comparative Example 2

A foam having an expansion ratio of about 5 times was prepared according to a similar method to that of Example 1 except that powdery calcium titanate was used instead of the plate-like calcium titanate.

The specific gravity, dielectric constant and dielectric loss tangent were measured for the foams obtained in the above-mentioned Examples 1 and 2 and Comparative Examples 1 and 2. The measurements were made at 25° C., 12 GHz and by wave guide tube method respectively, and the condition was similar for the following Examples and Comparative Examples. The results are shown in Table 1.

TABLE 1

| | Inorganic Filler | Amount to be Incorporated | Specific Gravity | Dielectric constant ($\epsilon r$) | Dielectric Loss Tangent (tan δ) | Expansion Ratio |
|---|---|---|---|---|---|---|
| Example 1 | plate-like calcium titanate | 100 | 0.298 | 1.91 | 0.0007 | 5 times |
| Example 2 | fibrous calcium titanate | 100 | 0.298 | 1.87 | 0.0009 | 5 times |
| Comparative Example 1 | — | 0 | 0.184 | 1.24 | 0.0005 | 5 times |
| Comparative Example 2 | powdery calcium titanate | 100 | 0.299 | 1.76 | 0.001 | 5 times |

The dimensional properties of the fibrous or plate-like alkaline earth metal titanate salt in the table are as follows.

Example 1: plate-like calcium titanate having a mean long diameter of 8 µm, a mean short diameter of 5 µm, a mean thickness of 1.0 µm and an aspect ratio (mean long diameter/mean thickness) of 8.

Example 2: fibrous calcium titanate having a mean fiber diameter of 0.5 µm, a mean fiber length of 7 µm and an aspect ratio (mean fiber length/mean fiber diameter) of 14.

Comparative Example 2: powdery calcium titanate having a mean particle size of 1 µm.

As is apparent from Table 1, the foams of the present invention have a high dielectric constant, even though they contain the same amount of dielectric inorganic filler and have the same expansion ratio as that of the Comparative Examples.

Example 3

A foam having an expansion ratio of about 5 times was prepared according to a similar method to that of Example 1 except that plate-like barium titanate (a mean long diameter of 10 µm, a mean short diameter of 6 µm, a mean thickness of 1.2 µm and an aspect ratio (mean long diameter/mean thickness) of 8.3) (200 parts by weight) was used instead of the plate-like calcium titanate.

The specific gravity of the obtained foam was 0.417. The dielectric constant and dielectric loss tangent thereof were 2.62 and 0.0130 respectively.

Example 4

A foam having an expansion ratio of about 5 times was prepared according to a similar method to that of Example 1 except that plate-like strontium titanate (having a mean long diameter of 10 µm, a mean short diameter of 5 µm, a mean thickness of 1.1 µm and an aspect ratio (mean long diameter/mean thickness) of 9) (200 parts by weight) was used instead of the plate-like calcium titanate.

The specific gravity of the obtained foam was 0.401. Furthermore, the dielectric constant and dielectric loss tangent thereof were 2.37 and 0.0008 respectively.

Example 5

A foam having an expansion ratio of about 5 times was prepared according to a similar method to that of Example 1 except that fibrous calcium strontium titanate (having a mean fiber diameter of 0.6 µm, a mean fiber length of 6 µ/m and an aspect ratio (mean fiber length/mean fiber diameter) of 10) (200 parts by weight) was used instead of the plate-like calcium titanate.

The specific gravity of the obtained foam was 0.394. Furthermore, the dielectric constant and dielectric loss tangent thereof were 2.59 and 0.0006 respectively.

Example 6

Polyethylene (LDPE, density 0.922, MFR 1.1) (100 parts by weight), fibrous calcium titanate (same as that used in Example 2, 100 parts by weight), talc (1 parts by weight) and sodium carbonate (0.01 parts by weight) were fed into a biaxial extruder (trade name: KTX46, manufactured by Kobe Steel Ltd.) and melt-kneaded under the temperature of 170° C. to prepare resin beads having particle size of 0.8 to 1.2 mm (pellets to be expanded are referred to "beads").

The resin beads (1500 g), ion exchanged water (3000 g), pentane (100 g), basic calcium triphosphate (20 g) and sodium n-pallafin sulfonate (0.3 g) were charged in an autoclave (5 liter volume) equipped with a valve at the lower portion thereof, which can release the contents to the outside with keeping the internal pressure, and maintained at 120° C. for 2 hours to impregnate the resin beads with pentane. The pentane-impregnated resin beads were released under the atmospheric pressure, from the valve at the lower portion of the autoclave, through an orifice plate having a pore diameter of 4.4 mm and expanded to prepare pre-expanded beads having an expansion ratio of about 10 times.

The pre-expanded beads were maintained at 35° C. for 6 hours and put into a pressure-resistant vessel, compressed by air pressure, and filled into a block mold of 320×320×60 mm at the compressibility of 36%.

Steam having a vapor pressure of 1.0 kgf/cm$^2$ was then introduced into the mold so as to purge air from the mold. Steam having the same vapor pressure as above was then introduced thereinto for 30 seconds, and the filled, pre-expanded beads were expansion molded and then cooled. The molded article that had been taken from the mold was cure dried under the temperature of 80° C. for 20 hours. Thus, a foam having good surface appearance was prepared.

The specific gravity of the obtained foam was 0.150. The dielectric constant and dielectric loss tangent thereof were 1.52 and 0.0006 respectively.

Figure 2:
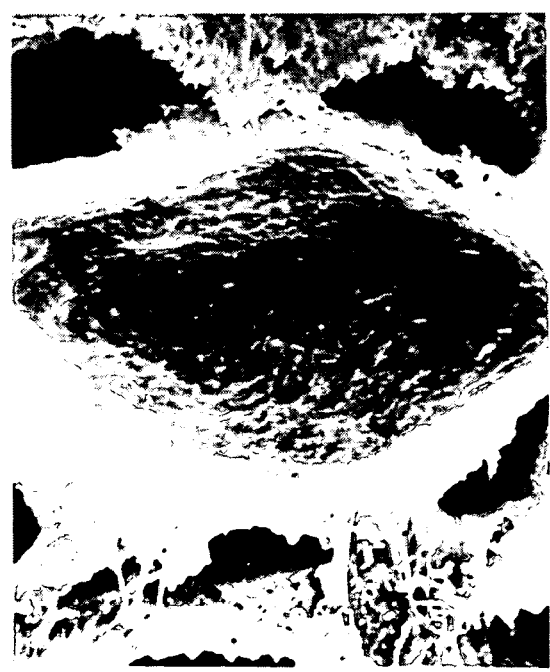
FIG. 2 shows the same electric microscope photograph as above (1000 magnifications).

The foam was then cut to have a cutting plane observed with an electric microscope. The texture thereof is shown in FIGS. 1 and 2. It was observed in the foam of the present invention that the fibrous calcium titanate was not oriented in a uniform direction but rather was irregularly dispersed. Furthermore, measurement of the foam for the dielectric constant and dielectric loss tangent from multiple directions showed a generally constant dielectric constant and dielectric loss tangent within measurement error.

Example 7

Pre-expanded beads were prepared according to a similar method to that of Example 6 except that hexane instead of pentane, basic calcium carbonate instead of basic calcium triphosphate and dodecylbenzene sulfonate instead of sodium n-pallafin sulfonate were used. The pre-expanded beads were maintained at 40° C. for 6 hours and fed into a pressure-resistant vessel, compressed by air pressure, and filled into a spherically shaped mold having a diameter of 320 mm at the compressibility of 36%. Steam having a vapor pressure of 1.0 kg f/cm$^2$ was then introduced into the mold so as to purge air from the mold. Furthermore, steam having the same vapor pressure as above was introduced thereinto for 30 seconds, and the filled, pre-expanded beads were expansion molded and then cooled. The molded article that had been taken from the mold was cure dried under the temperature of 80° C. for 20 hours. Thus, a spherical foam having good surface appearance was prepared.

The specific gravity of the obtained foam was 0.153. The dielectric constant and dielectric loss tangent thereof were 1.49 and 0.0007 respectively.

The foam was then cut to have a cutting plane observed with an electric microscope. It was observed that the fibrous calcium titanate was not oriented in a uniform direction but rather was irregularly dispersed. Furthermore, the measurement of the foam for the dielectric constant and dielectric loss tangent from multiple directions showed a generally constant dielectric constant and dielectric loss tangent within measurement error.

Comparative Example 3

Polyethylene (LDPE, density 0.922, MFR 1.1) (100 parts by weight), fibrous calcium titanate (same as that used in Example 2) (100 parts by weight), talc (1 parts by weight) and sodium carbonate (0.01 parts by weight) were fed into a biaxial extruder (trade name: KTX46, manufactured by Kobe Steel Ltd.) and melt-kneaded under the temperature of 170° C. to prepare resin pellets having a particle size of 0.8 to 1.2 mm.

The resin pellet was injection molded with an injection molding machine having a block mold of 320×320×60 mm, under the condition of the cylinder temperature of 170° C., injection pressure of 600 kgf/cm² and mold temperature of 40° C. to prepare a block. The specific gravity of the obtained block was 1.48, the dielectric constant thereof was 8.5, and the dielectric loss tangent thereof was 0.0018.

Figure 3:
FIG. 3 shows an electric microscope photograph (1500 magnifications) as an alternative to a figure, which shows the state of dispersion of the dielectric inorganic filler on the cutting plane of the dielectric resin molded form according to Comparative Example 3.
Figure 3:

The block was cut to have a cutting plane observed with an electric microscope. The texture is shown in FIG. 3. It was confirmed that the fibrous calcium titanate in the block was oriented.

The block showed the above-mentioned value of dielectric properties in the orientation direction of the fibrous calcium titanate, whereas it showed different dielectric constant and dielectric loss tangent in a direction perpendicular to the orientation direction.

As is apparent from the Examples 6 and 7 and Comparative Example 3, the foam of the present invention is made up of a lightweight substance having uniform dielectric properties over all directions, and is therefore preferable for dielectric parts, specifically a lens for an antenna, and more specifically for a lens of a Luneberg lens antenna for tracking low-earth-orbit satellites.

Example 8

Figure 4:
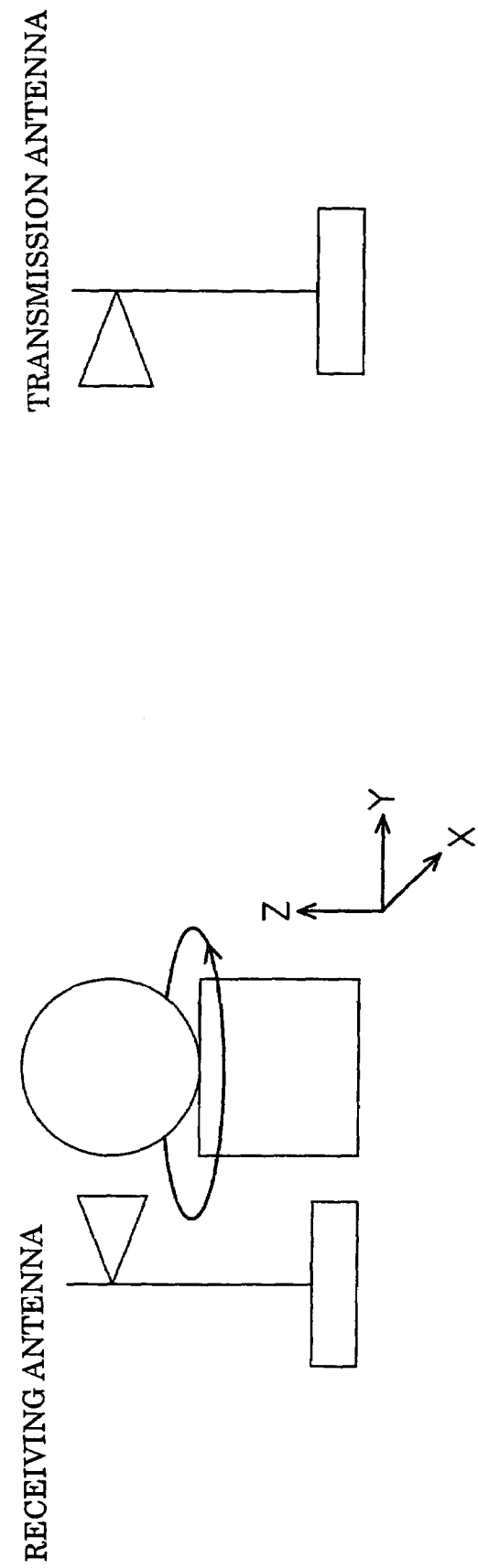
FIG. 4 is a schematic view which shows an apparatus for measurement of gain values of main beams in Examples 8 and 9, and Comparative Examples 4 and 5.

A spherical lens (foamed product) having a dielectric constant of 3.4 was prepared according to a similar method to that of Example 6, except that the amount of pentane to be charged during pre-expansion was 30 g, the pre-expanded beads having the expansion ratio of about 3 times was prepared, and the pre-expanded beads and a spherically shaped mold having a diameter of 450 mm were used. The lens was used for a receiving antenna as shown in FIG. 4, and in the measurement system as shown in FIG. 4, the gain value of the main beam that was transmitted from and received with a transmission antenna was measured. The result of the measurement is shown in Table 2.

The lens was evaluated for its uniformity of the gain of the main beam as it was revolved on the x-y plane as shown in FIG. 4 through 360 degrees. It showed a uniform profile with substantially no error.

Comparative Example 4

A spherical lens having a dielectric constant of 3.4 was prepared according to a similar method to that of Example 8, except that particulate calcium titanate was used instead of fibrous calcium titanate and the amount of pentane to be charged during pre-expansion was 37 g. The gain of the main beam was measured under the same condition as that of Example 8 except that the lens was used for a receiving antenna as shown in FIG. 4. The result of the measurement is shown in Table 2.

In the same manner as Example 8, the lens was evaluated for its uniformity of the gain of the main beam as it was revolved on the x-y plane as shown in FIG. 4 through 360 degrees. It showed a large error of ±2.0 dB.

TABLE 2

|  | Dielectric constant (εr) | Gain (dB) | Weight (kg) |
|---|---|---|---|
| Example 8 | 3.4 | 29.4 | 38 |
| Comparative Example 4 | 3.4 | 27.1 | 45 |

As is apparent from Example 8 and Comparative Example 4, the lens of the present invention is lightweight while it has high (large) gain.

Example 9

A spherical foam having a dielectric constant of 2.94 and a diameter of 370 mm was prepared according to a similar method to that of Example 6, except that the amount of the pentane to be charged during pre-expansion was 34 g, pre-expanded beads having an expansion ratio of about 3 times were prepared, and these pre-expanded beads and a mold having different shape were used. Two hemispherical shell foams each having a dielectric constant of 2.05, an outer diameter of 422 mm and an inner diameter of 370 mm were also prepared according to a similar method to that of Example 6, except that the amount of the pentane to be charged during pre-expansion was 56 g, pre-expanded beads having an expansion ratio of about 5 times were prepared, and these pre-expanded beads and a mold having different shape were used. Furthermore, two hemispherical shell foams each having a dielectric constant of 1.50, an outer diameter of 450 mm and an inner diameter of 422 mm were also prepared according to a similar method to that of Example 6 (materials and methods used herein were also the same as those in Example 6), except that a mold used had a different shape.

Those foams were combined together to produce a Luneberg lens made up of three layers.

The gain of the main beam was measured under the same condition as that of Example 8 except that the lens herein was used as a lens for a receiving antenna. The result of the measurement is shown in Table 3.

In the same manner as Example 8, the lens was evaluated for its uniformity of the gain of the main beam as it was revolved on the x-y plane as shown in FIG. 4 through 360 degrees. It showed a uniform profile with substantially no error.

Comparative Example 5

A spherical foam having a dielectric constant of about 2.94 and a diameter of 370 mm, two hemispherical shell foams each having a dielectric constant of about 2.05 an outer diameter of 422 mm and an inner diameter of 370 mm, and two hemispherical shell foams each having a dielectric constant of about 1.50, an outer diameter of 450 mm and an inner diameter of 422 mm, were prepared respectively according to a similar method to that of Example 9, except that particulate calcium titanate was used instead of fibrous calcium titanate and the amounts of the pentane to be charged during pre-expansion were 35 g, 59 g and 110 g respectively and pre-expanded beads each having expansion ratio of about 3 times, 5 times, 10 times were prepared respectively, and these pre-expanded beads were used respectively. These forms were combined together to produce a Luneberg lens made up of three layers.

The gain of the main beam was measured under the same condition as that of Example 9 except that the lens was used for a receiving antenna. The result of the measurement is shown in Table 3.

In the same manner as Example 9, the lens was evaluated for its uniformity of the gain of the main beam as it was revolved on the x-y plane as shown in FIG. 4 through 360 degrees. It showed a large error of ±1.5 dB.

TABLE 3

| | Outer Diameter (mm) | | | Inner Diameter (mm) | | Dielectric constant | | | Gain (dB) | Weight (kg) |
|---|---|---|---|---|---|---|---|---|---|---|
| | 1st layer | 2nd layer | 3rd layer | 2nd layer | 3rd layer | 1st layer | 2nd layer | 3rd layer | | |
| Example 9 | 370 | 422 | 450 | 370 | 422 | 2.94 | 2.05 | 1.50 | 29.8 | 14 |
| Comparative Example 5 | 370 | 422 | 450 | 370 | 422 | 2.94 | 2.05 | 1.50 | 27.8 | 17 |

As is apparent from Example 9 and Comparative Example 5, the lens of the present invention is lightweight while it has high (large) gain.

As mentioned above, the dielectric foam resin according to the present invention has high and uniform dielectric properties, and therefore is preferably used as a dielectric material for a spherical lens, a Luneberg lens and the like.

The invention claimed is:

1. A lense for radio waves comprising a dielectric resin foam obtained by three-dimensionally expanding a resin composition comprising a synthetic resin and at least one of a fibrous alkaline earth metal titanate and a plate-like alkaline earth metal titanate, wherein the at least one of the fibrous alkaline earth metal titanate and the plate-like alkaline earth metal titanate are non-uniformly oriented in the thermoplastic resin, and wherein the dielectric resin foam comprises uniform dielectric properties, wherein said lens has a constant dielectric constant and a spherical shape.

2. A lens for radio waves comprising a dielectric resin foam obtained by three dimensionally expanding a resin composition comprising a synthetic resin and at least one of a fibrous alkaline earth metal titanate and a plate-like alkaline earth metal titanate, wherein the at least one of the fibrous alkaline earth metal titanate and the plate-like alkaline earth metal titanate are non-uniformly oriented in the thermoplastic resin, wherein the dielectric resin foam comprises uniform dielectric properties, and wherein said dielectric resin foam is formed into a Luneberg lens, said Luneberg lens having a spherical shape and multiple layers each having a different dielectric constant, said multiple layers being concentrically overlapped to each other, thereby forming a concentric sphere.

* * * * *